(12) United States Patent  
Sekiguchi

(10) Patent No.: US 8,104,876 B2
(45) Date of Patent: Jan. 31, 2012

(54) LIQUID TRANSPORTING APPARATUS AND PIEZOELECTRIC ACTUATOR

(75) Inventor: Yasuhiro Sekiguchi, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 298 days.

(21) Appl. No.: 12/284,991

(22) Filed: Sep. 26, 2008

(65) Prior Publication Data

US 2009/0085988 A1    Apr. 2, 2009

(30) Foreign Application Priority Data

Sep. 28, 2007 (JP) ................................. 2007-253712

(51) Int. Cl.
*B41J 2/045* (2006.01)

(52) U.S. Cl. .......................................... 347/70; 310/328

(58) Field of Classification Search ............... 347/68–72
See application file for complete search history.

(56) References Cited

U.S. PATENT DOCUMENTS

| | | | | |
|---|---|---|---|---|
| 4,242,541 A * | 12/1980 | Ando | ............................... | 381/99 |
| 4,396,895 A * | 8/1983 | Shimizu et al. | ................ | 333/189 |
| 5,121,024 A * | 6/1992 | Seto | ................ | 310/320 |
| 5,373,267 A * | 12/1994 | Kaida et al. | .................... | 333/187 |
| 5,512,793 A * | 4/1996 | Takeuchi et al. | ................ | 310/328 |
| 5,644,273 A * | 7/1997 | Kaida et al. | .................... | 333/187 |
| 6,217,158 B1 * | 4/2001 | Kanaya et al. | .................. | 347/70 |
| 6,919,667 B2 * | 7/2005 | Yamaguchi et al. | ......... | 310/324 |
| 2003/0048042 A1 * | 3/2003 | Yamaguchi et al. | .......... | 310/328 |
| 2003/0132991 A1 * | 7/2003 | Higuchi et al. | ................ | 347/70 |
| 2004/0245892 A1 * | 12/2004 | Yamada et al. | ................ | 310/320 |
| 2005/0068376 A1 * | 3/2005 | Sugahara | ........................ | 347/68 |
| 2006/0108897 A1 * | 5/2006 | Nanataki et al. | ............... | 310/324 |
| 2006/0290240 A1 * | 12/2006 | Kitagawa et al. | .............. | 310/358 |
| 2007/0211114 A1 * | 9/2007 | Hibi et al. | ........................ | 347/57 |
| 2008/0100676 A1 * | 5/2008 | Sakaida | .......................... | 347/70 |
| 2009/0314062 A1 * | 12/2009 | Tsuyoshi et al. | .............. | 73/53.01 |

FOREIGN PATENT DOCUMENTS

| | | | |
|---|---|---|---|
| EP | 1006651 A2 * | 6/2000 | |
| JP | 62221211 A * | 9/1987 | |
| JP | 63004959 A * | 1/1988 | |
| JP | 05343944 A * | 12/1993 | |
| JP | 9272202 | 10/1997 | |
| JP | 2003311983 | 11/2003 | |
| JP | 2004266701 A * | 9/2004 | |
| JP | 2005-26370 | 1/2005 | |

* cited by examiner

*Primary Examiner* — Charlie Peng
*Assistant Examiner* — Peter Radkowski
(74) *Attorney, Agent, or Firm* — Frommer Lawrence & Haug LLP

(57) ABSTRACT

A liquid transporting apparatus includes a piezoelectric actuator which applies a pressure to liquid in a pressure chamber and which has a vibration plate covering the pressure chamber; a piezoelectric layer formed on a surface, of the vibration plate, not facing the pressure chamber; an electrode formed on a surface of the piezoelectric layer not facing the vibration plate at a portion facing the pressure chamber; a contact point formed on the surface of the piezoelectric layer not facing the vibration plate; and a connecting portion formed on the surface of the piezoelectric layer not facing the vibration plate and connecting the electrode and the contact point; and the connecting portion extends from the contact point and is connected to a portion, of the electrode, which is different from a nearest portion nearest to the contact point.

12 Claims, 15 Drawing Sheets

SCANNING DIRECTION

PAPER FEEDING DIRECTION

LIQUID TRANSPORTING APPARATUS AND PIEZOELECTRIC ACTUATOR

CROSS REFERENCE TO RELATED APPLICATION

The present application claims priority from Japanese Patent Application No. 2007-253712, filed on Sep. 28, 2007, the disclosure of which is incorporated herein by reference in its entirety.

BACKGROUND OF THE INVENTION

1. Field of the Invention

The present invention relates to a liquid transporting apparatus which transports a liquid, and a piezoelectric actuator which is deformed by being applied an electric potential.

2. Description of the Related Art

In an ink-jet recording head disclosed in Japanese Patent Application Laid-open No. 2003-311983, a connecting electrode (a contact point) is connected to an end portion of an individual electrode which is arranged in a portion facing an ink chamber (pressure chamber) of an upper surface of a piezoelectric layer. The connecting electrode has a base layer which is connected to the individual electrode made of a metallic material and which has lower wettability, and an electrode drawing layer formed in an area, of the base layer, excluding a peripheral portion. Moreover, when the electrode drawing layer and a power supply terminal are connected by solder (an electroconductive adhesive), the solder is stopped by the base layer having lower wettability, and is prevented from flowing into a surface of the individual electrode.

However, in the ink-jet recording head described in Japanese Patent Application Laid-open No. 2003-311983, since the connecting electrode has a structure in which the electrode drawing layer is formed on the upper surface of the base layer made of a material different from the individual electrode, the base layer and the electrode drawing layer are to be formed separately, and there is a possibility that a manufacturing process of the ink-jet recording head becomes complicated.

SUMMARY OF THE INVENTION

An object of the present invention is to provide a liquid transporting apparatus and a piezoelectric actuator which can be manufactured easily, and which are capable of preventing the electroconductive adhesive from flowing into the surface of the individual electrode.

According to a first aspect of the present invention, there is provided a liquid transporting apparatus which transports a liquid, including a channel unit which has a liquid transporting channel through which the liquid flows, and a pressure chamber which is formed in the liquid transporting channel; a piezoelectric actuator which applies a pressure to the liquid in the pressure chamber and which has a vibration plate covering the pressure chamber; a piezoelectric layer formed on a surface, of the vibration plate, not facing the pressure chamber; an electrode formed on a surface of the piezoelectric layer not facing the vibration plate at a portion facing the pressure chamber; a contact point formed on the surface of the piezoelectric layer not facing the vibration plate; and a connecting portion formed on the surface of the piezoelectric layer not facing the vibration plate and connecting the electrode and the contact point; and a driver IC which applies a driving pressure to the piezoelectric actuator; and a wiring member which connects the driver IC and the piezoelectric actuator and to which the contact point is connected via an electroconductive adhesive; wherein the connecting portion extends from the contact point and is connected to a portion, of the electrode, which is different from a nearest portion nearest to the contact point.

When the contact point and the wiring member are connected by the electroconductive adhesive, if the electroconductive adhesive flows from the contact point to a surface of the electrode, due to an effect of the flowed electroconductive adhesive, a deformation amount of the piezoelectric layer and the vibration plate, at the time of being applied a drive voltage to the electrode, is decreased. As a result, there is a possibility that, liquid transporting characteristic in the liquid transporting channel is changed. However, according to the present invention, since the connecting portion extends from the contact point, and is connected to the portion, of the electrode, which is different from the nearest portion nearest to the contact point of the electrode, a length of the connecting portion is long, and the electroconductive adhesive which has flowed from the contact point into the surface of the connecting portion hardly flows into the surface of the electrode.

Furthermore, since it is possible to form the electrode, the contact point, and the connecting portion at one time, it is possible to form the electrode, the contact point, and the connecting portion easily. The electroconductive adhesive means an electroconductive material such as solder, which is applied in a liquid form and which is cured by a surrounding temperature or irradiation of light.

In the liquid transporting apparatus of the present invention, the connecting portion may form a bypass which has a length longer than a shortest distance between the contact point and the nearest portion. In this case, since the electroconductive adhesive flows from the contact point into the surface of the connecting portion which forms the bypass having a length which is longer than the shortest distance between the contact point and the nearest portion, the electroconductive adhesive hardly flows into the surface of the electrode.

In the liquid transporting apparatus of the present invention, the electrode may extend in a predetermined direction from the nearest portion, and the connecting portion may be connected to an end portion of the electrode on a side opposite to the nearest portion. In this case, since the connecting portion is connected to an end portion, of the electrode, on a side opposite to an end at which the nearest portion of the electrode is provided, the connecting portion becomes sufficiently long, and the electroconductive adhesive which has flowed from the contact point into the surface of the connecting portion hardly flows into the surface of the electrode.

In the liquid transporting apparatus of the present invention, the electrode may be arranged to face a central portion of the pressure chamber, and the connecting portion may be arranged to face a portion, of the pressure chamber, at outside of the central portion of the pressure chamber. When the electrode is arranged to face the central portion of the pressure chamber, since any electrode is not arranged in a portion at an outer side of the electrode out of a portion, of the piezoelectric layer, facing the pressure chamber, it is possible to arrange the connecting portion at outside of the electrode. In this case, it is not necessary to provide the connecting portion at a portion, of the piezoelectric layer, facing a portion between the plurality of pressure chambers, and it is possible to arrange the pressure chambers highly densely.

In the liquid transporting apparatus of the present invention, the electrode may be arranged to face a peripheral portion of the pressure chamber, and the connecting portion may be arranged to face a portion, of the pressure chamber, at inner side of the peripheral portion of the pressure chamber. When the electrode is arranged to face the peripheral portion of the pressure chamber, since any electrode is not arranged in a portion, of the piezoelectric layer, at inner side of the electrode out of the portion facing the pressure chamber, it is possible to arrange the connecting portion at the inner side of the electrode. In this case, it is not necessary to provide the connecting portion at the portion, of the piezoelectric layer, facing the portion between the pressure chambers, and it is possible to arrange the pressure chambers highly densely.

In the liquid transporting apparatus of the present invention, the connecting portion may be arranged on the piezoelectric layer at outside of a portion of the piezoelectric layer facing the pressure chamber. When the connecting portion is arranged in the portion facing the pressure chamber, due to an effect of the electroconductive adhesive which has flowed into the surface, there is a possibility that the deformation amount of the piezoelectric layer and the vibration plate decreases slightly. However, since the connecting portion is arranged at the outer side of the portion facing the pressure chamber, even when the electroconductive adhesive has flowed into the connecting portion, the deformation amount of the piezoelectric layer and the vibration plate does not decrease.

In the liquid transporting apparatus of the present invention, the contact point, the connecting portion, and the electrode may be formed of a same electroconductive material. In this case, since it is possible to form the contact point, the connecting portion, and the electrode by the same material at one time, it is possible to form the contact point, the connecting portion, and the electrode easily.

According to a second aspect of the present invention, there is provided a piezoelectric actuator including: a vibration plate; a piezoelectric layer which is formed on one surface of the vibration plate; an electrode formed on a surface of the piezoelectric layer not facing the vibration plate; a contact point formed on the surface of the piezoelectric layer not facing the vibration plate, and connected via an electroconductive adhesive to a wiring member which applies a drive voltage to the electrode; and a connecting portion formed on the surface of the piezoelectric layer not facing the vibration plate, and connecting the electrode and the contact point, wherein the connecting portion extends from the contact point, and is connected to a portion, of the electrode, which is different from a nearest portion nearest to the contact point.

According to the second aspect of the present invention, when the contact point and the wiring member are connected by the electroconductive adhesive, if the electroconductive adhesive flows from the contact point into a surface of the electrode, due to the effect of the flowed electroconductive adhesive, the deformation amount of the piezoelectric layer and the vibration plate, at the time of being applied a drive voltage to the electrode decreases. As a result, there is a possibility that liquid transporting characteristics of the liquid transporting channel is changed. However, according to the present invention, since the connecting portion extends from the contact point, and is connected to the portion, of the electrode, which is different from the nearest portion nearest to the contact point of the electrode, a length of the connecting portion is long, and the electroconductive adhesive which has flowed from the contact point into the surface of the connecting portion hardly flows into the surface of the electrode.

In the piezoelectric actuator of the present invention, the connecting portion may form a bypass which has a length longer than the shortest distance between the contact point and the nearest portion. Moreover, the electrode may extend in a predetermined direction from the nearest portion, and the connecting portion may be connected to an end portion of the electrode on a side opposite to the nearest portion.

In the piezoelectric actuator of the present invention, the electrode may be arranged to face a central portion of the pressure chamber, and the connecting portion may be arranged to face a portion, of the pressure chamber, at outside of the central portion of the pressure chamber. Moreover, the electrode may be arranged to face a peripheral portion of the pressure chamber, and the connecting portion may be arranged to face a portion, of the pressure chamber, at inside of the peripheral portion of the pressure chamber. Moreover, the connecting portion may be arranged on the piezoelectric layer at outside of a portion of the piezoelectric layer facing the pressure chamber.

In the piezoelectric actuator of the present invention, the contact point, the connecting portion, and the electrode may be formed of a same electroconductive material.

DETAILED DESCRIPTION OF THE PREFERRED EMBODIMENTS

An exemplary embodiment of the present invention will be described below.

Figure 1:
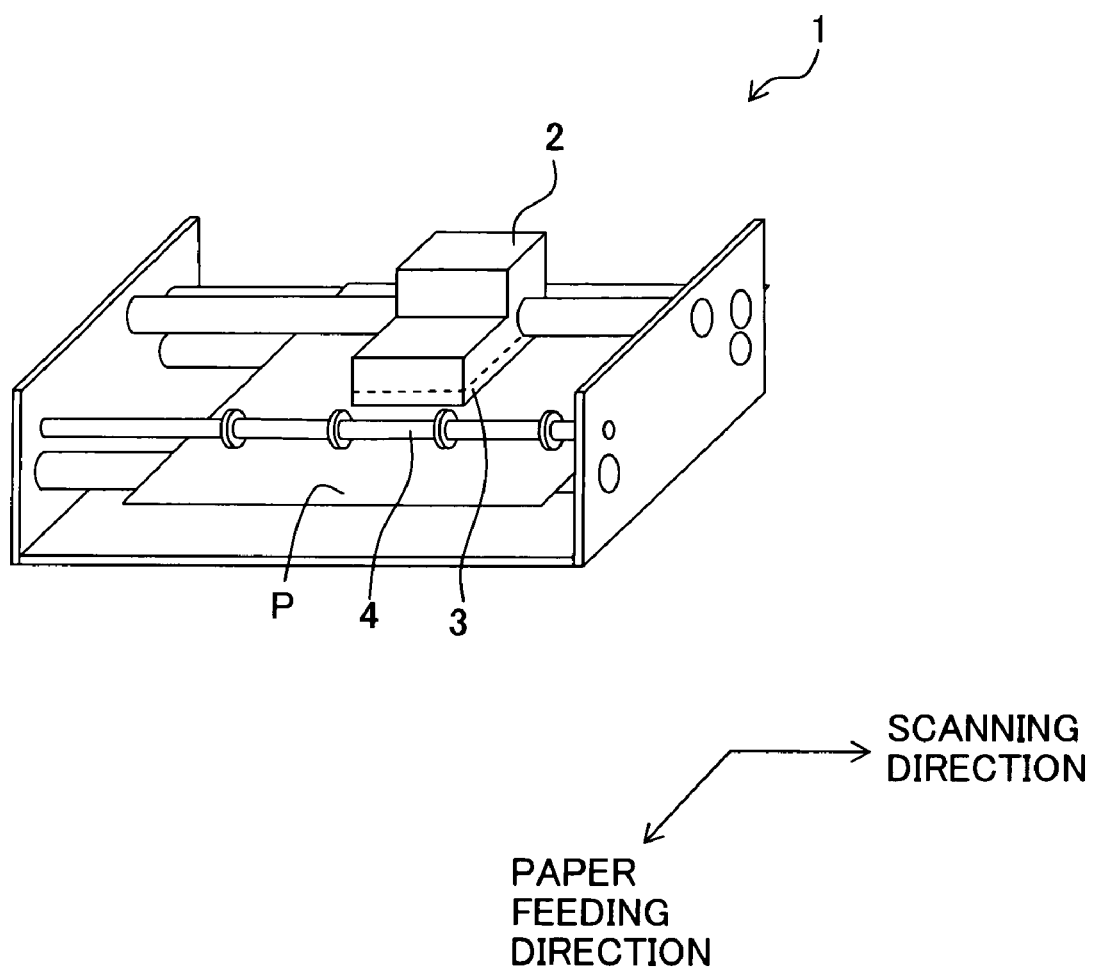
FIG. 1 is a schematic structural view of a printer according to an embodiment of the present invention.

FIG. 1 is a schematic structural view of a printer according to an embodiment of the present invention. As shown in FIG. 1, a printer 1 includes a carriage 2, an ink-jet head (liquid transporting apparatus), and paper transporting rollers 4. The carriage 2 reciprocates in a left-right direction (scanning direction) in FIG. 1. The ink-jet head 3 is installed on a lower surface of the carriage 2, and jets an ink from nozzles 15 (refer to FIG. 2) which will be described later. The paper transporting rollers 4 transport a recording paper P in a frontward direction (paper feeding direction). Moreover, in the printer 1, printing is carried out on the recording paper P which is transported in the paper feeding direction by the paper transporting rollers 4, by jetting the ink from the nozzles 15 of the ink-jet head 3 which reciprocates in the scanning direction together with the carriage 2 (refer to FIG. 2).

Figure 2:
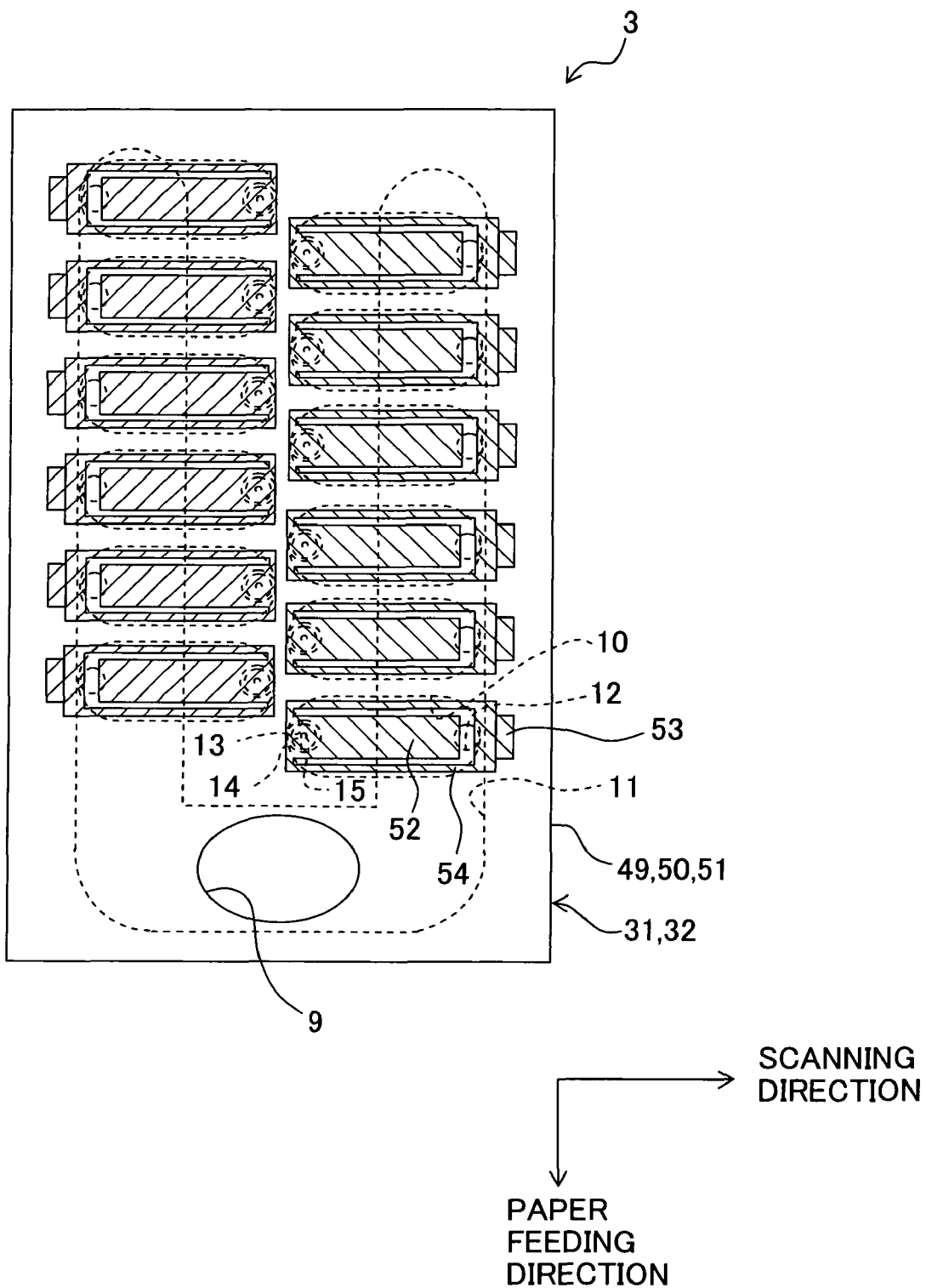
FIG. 2 is a plan view of an ink-jet head in FIG. 1.
Figure 3:
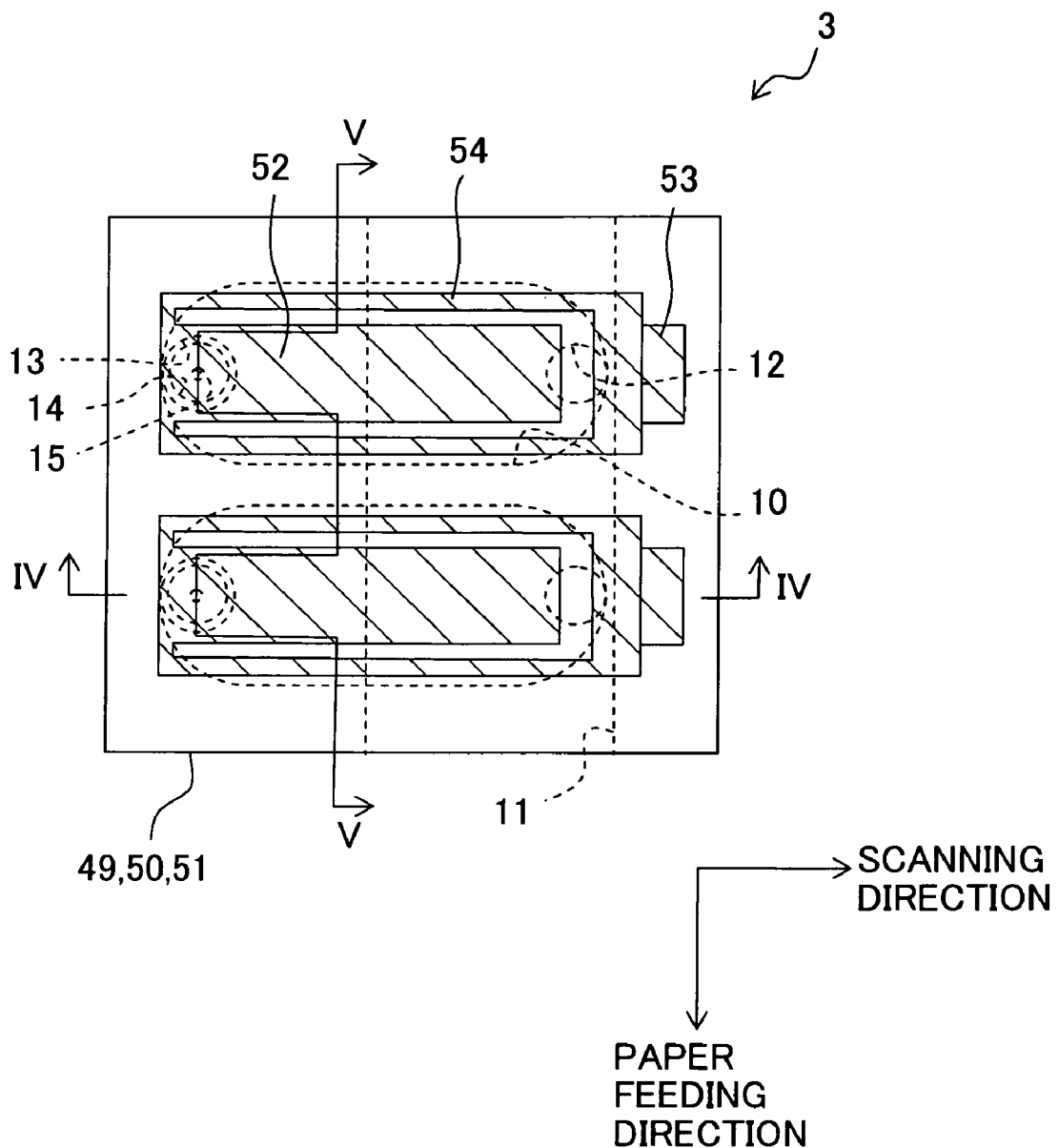
FIG. 3 is a partially enlarged view of FIG. 2.
Figure 4:
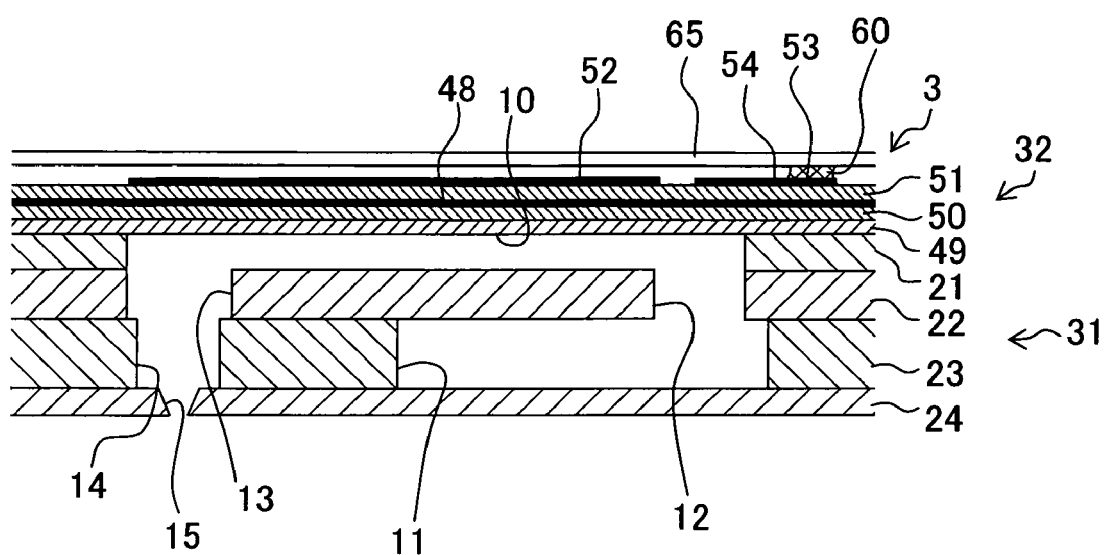
FIG. 4 is a cross-sectional view taken along a line IV-IV in FIG. 3.
Figure 5:
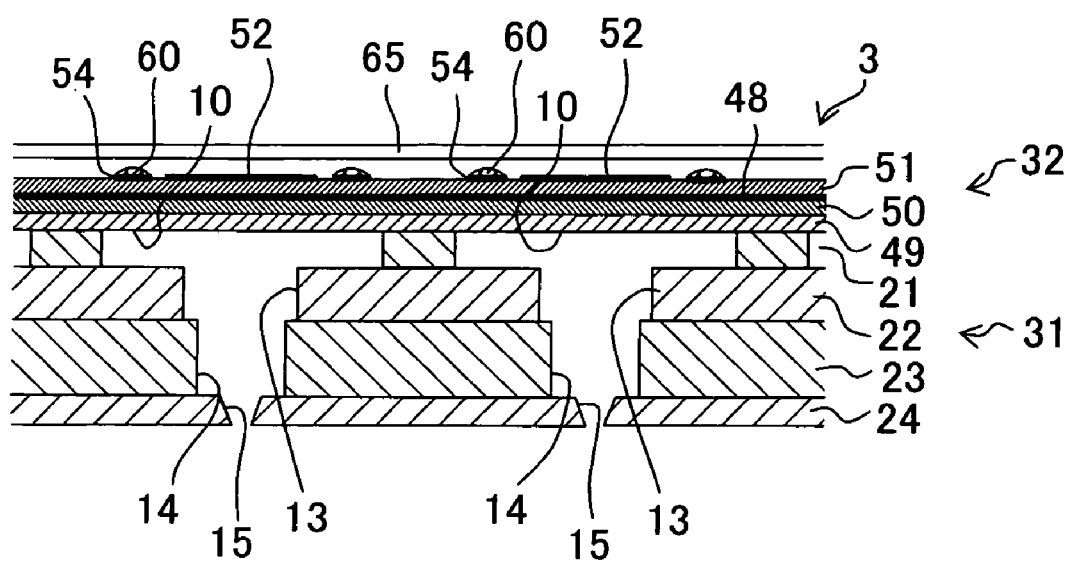
FIG. 5 is a cross-sectional view taken along a line V-V in FIG. 3.

Next, the ink-jet head 3 will be described below. FIG. 2 is a plan view of the ink-jet head 3 in FIG. 1. FIG. 3 is a partially enlarged view of FIG. 2. FIG. 4 is a cross-sectional view taken along a line IV-IV in FIG. 3. FIG. 5 is a cross-sectional view taken along a line V-V in FIG. 3. To make the diagrams easily understandable, in FIG. 2 and FIG. 3, an individual electrode 52, a contact point 53, and a connecting portion 54 which will be described later have been hatched.

As shown in FIG. 2 to FIG. 5, the ink-jet head 3 includes a channel unit 31 in which ink channels (liquid transporting channels) having a manifold channel 11, pressure chambers 10, and the nozzles 15 which will be described later are formed, and a piezoelectric actuator 32 which is arranged on an upper surface of the channel unit 31.

The channel unit 31 is formed by a cavity plate 21, a base plate 22, a manifold plate 23, and a nozzle plate 24, and these four plates are stacked in this order from the top. From among these four plates 21 to 24, the cavity plate 21, the base plate 22, and the manifold plate 23 are made of a metallic material such as stainless steel, and the nozzle plate 24 is made of a synthetic resin material such as polyimide. Or the nozzle plate 24 may also be formed of a metallic material, similar to the other three plates 21 to 23.

The plurality of pressure chambers 10 is formed in the cavity plate 21. The pressure chamber 10 has a substantially elliptical flat shape in which a longitudinal direction of the ellipse is the scanning direction (left-right direction in FIG. 2). The pressure chambers 10 form a pressure chamber row by being arranged in a line in the paper feeding direction (vertical direction in FIG. 2), and two such pressure chamber rows are arranged along the scanning direction. Through holes 12 and 13 are formed in portions facing both end portions in the scanning direction of the pressure chamber 10 respectively.

The manifold channel 11 is formed in the manifold plate 23. The manifold channels 11 extend as two rows facing mutually in the paper feeding direction, such that one of the manifold channels 11 faces a substantially left-half portion of the pressure chambers 10 forming the pressure chamber row on a left side in FIG. 2 and the other of the manifold channels 11 faces a substantially right-half portion of the pressure chambers 10 forming the pressure chamber row on a right side in FIG. 2 respectively. The portions extend in these two rows communicate with each other at a lower end portion in FIG. 2. The ink is supplied to the manifold channel 11 from an ink supply port 9 which is formed in a portion, of a vibration plate 49 which will be described later, facing the lower end portion in FIG. 2 of the manifold channel 11. Moreover, a through hole 14 is formed in the manifold plate 23, at a portion facing the through hole 13.

The nozzle 15 is formed in the nozzle plate 24, at a portion facing the through hole 14. In the channel unit 31, the manifold channel 11 communicates with the pressure chamber 10 via the through hole 12, and the pressure chamber 10 communicates with the nozzle 15 via the through holes 13 and 14. In this manner, a plurality of individual ink channels from outlets of the manifold channel 11 to nozzles 15 via the pressure chambers 10 is formed in the channel unit 31.

The piezoelectric actuator 32 includes the vibration plate 49, piezoelectric layers 50 and 51, a common electrode 48, a plurality of individual electrodes 52, a plurality of contact points 53, and a plurality of connecting portions 54. The vibration plate 49 is in the form of a plate made of a material such as stainless steel. The vibration plate 49 is arranged on the upper surface of the cavity plate 21 to cover the pressure chambers 10, and is joined to the cavity plate 21.

The piezoelectric layers 50 and 51 are formed of a piezoelectric material which is a mixed crystal of lead titanate and lead zirconate, and is principally composed of lead zirconium titanate which is a ferroelectric substance. The piezoelectric layers 50 and 51 are stacked mutually, and are formed continuously on an upper surface of the vibration plate 49 (surface on a side not facing the pressure chamber 10), to spread over an area facing the pressure chambers 10. Moreover, the piezoelectric layer 51 is polarized in advance in a direction of thickness of the piezoelectric layer 51.

The common electrode 48 is made of an electroconductive material such as a metal, and is formed continuously between the piezoelectric layer 50 and the piezoelectric layer 51, to spread over an area facing the pressure chambers 10. The individual electrodes 52 are made of an electroconductive material same as an electroconductive material for the common electrode 48, and are provided on an upper surface of the piezoelectric layer 51 (surface on a side not facing the pressure chamber 10), corresponding to the pressure chambers 10. The individual electrode 52 has an area smaller than an area of the pressure chamber 10 in a plan view, and is rectangular shaped with a longitudinal direction in the scanning direction. The individual electrodes 52 are arranged to face the central portions of the pressure chambers 10 respectively.

The contact points 53 are made of the electroconductive material same as of the individual electrode 52. The contact points 53 are adjacent to an end of the individual electrode 52 at a side of the through hole 12 in the longitudinal direction, and are arranged in a portion not facing the pressure chamber 10. The contact points 53 are connected to a flexible circuit board (FPC) 65 (wiring member) for applying a driving electric potential (applying a drive voltage) to the individual electrode 52, which is arranged at an upper side of the piezoelectric layer 51, via a solder 60 (an electroconductive adhesive). The FPC 65 is connected to a driver IC which is not shown in the diagram, and the driver IC and the contact points 53 are connected via the FPC 65.

The connecting portions 54 are made of the electroconductive material same as of the individual electrode 52 and the contact point 53, and extend in two rows in the scanning direction on an upper surface of the piezoelectric layer 51. The connecting portions 54 extend in portions facing both end portions in a direction of a width of the pressure chamber 10 respectively (a portion of the pressure chamber 10 at an outer side of the portion facing the individual electrode 52). Moreover, both end portions of portions extending in the scanning direction are bent toward an inner side in the width direction of the pressure chamber 10, and are connected to the contact point 53 and an end of the individual electrode 52 on a side opposite to the contact point 53. In other words, the connecting portions 54 extend from the contact point 53, and are connected to the end of the individual electrode 52, on the side opposite to the contact point 53 (portion different from a nearest portion). In this manner, the connecting portion 54 forms a bypass, longer than the shortest path between the contact point 53 and an end portion, of the individual electrode 52, at the side of the contact point 53 (a nearest portion of the contact point 53, nearest to the individual electrode 52). Further, the contact point 53 and the individual electrode 52 are connected to each other via the connecting portion 54, and a driving electric potential is applied separately to the individual electrodes 52 via the FPC 65, the contact point 53, and the connecting portion 54. A width of the connecting portion 54 is sufficiently smaller than a width of the individual electrode 54 (length in a direction of a short side).

Here, in the embodiment, since the connecting portions 54 are not arranged at a portion, of the piezoelectric layer 51, facing an area between the adjacent pressure chambers 10 in the paper feeding direction, it is possible to arrange the pressure chambers 10 highly densely by shortening a distance between the adjacent pressure chambers 10 in the paper feeding direction. Moreover, since the connecting portions 54 and the abovementioned individual electrode 52 and the contact point 53 are formed of the same electroconductive material, it is possible to form the connecting portions 54, the individual electrode 52, and the contact point 53 at a time on the upper surface of the piezoelectric layer 51 by a method such as screen printing.

Next, a method of driving the piezoelectric actuator 32 will be described below. In the piezoelectric actuator 32, the individual electrodes 52 are kept at a ground electric potential in advance. When a driving electric potential is applied to the individual electrodes 52 kept at the ground electric potential, an electric potential difference is developed between the individual electrode 52 to which the driving electric potential is applied and the common electrode 48 kept at the ground electric potential. Accordingly, an electric field in a thickness direction of the piezoelectric layer 51 is generated in a portion of the piezoelectric layer 51 sandwiched between the individual electrode 52 and the common electrode 48. Since a direction of the electric field coincides with a direction in which the piezoelectric layer 51 is polarized, this portion of the piezoelectric layer 51 is contracted in a horizontal direction which is orthogonal to the direction of polarization. With the contraction of the piezoelectric layer 51, a portion of the piezoelectric layers 50 and 51 and the vibration plate 49 facing the pressure chamber 10 is deformed to project toward the pressure chamber 10, and due to this deformation, a volume of the pressure chamber 10 is decreased. Accordingly, a pressure of the ink inside the pressure chamber 10 is increased (a pressure is applied to the ink inside the pressure chamber 10), and the ink is jetted from the nozzle 15 communicating with the pressure chamber 10 (a liquid is transported through the liquid transporting channel).

Here, as it has been described above, when the contact point 53 and the FPC 65 are connected by the solder 60, if the solder 60 flows from the contact point 53 into a surface of the individual electrode 52, due to an effect of the flowed solder 60, a deformation amount of the piezoelectric layers 50 and 51, and the vibration plate 49 is decreased, and there is a possibility that jetting characteristics of the ink from the nozzle 15 (transporting characteristics of the liquid in the liquid transporting channel) are changed.

In a case of connecting the FPC 65 and the contact point 53 by using the solder 60 as the electroconductive adhesive, it is necessary to heat the solder 60. However, in the embodiment, the connecting portions 54 formed of an electroconductive material such as a metal have a higher thermal conductivity than a thermal conductivity of the piezoelectric layer 51. Therefore, it is possible to prevent the solder 60 flowed out from the contact point 53 to the surface of the connecting portions 54 from flowing into the individual electrode 52 upon passing traversely across the piezoelectric layer 51. Furthermore, the individual electrode 52 and the contact point 53 are connected via the connecting portions 54, and the connecting portions 54 are connected to the end of the individual electrode 52, on the side opposite to the contact point 53. Therefore, the length of paths connecting the contact point 53 and the individual electrode 52, formed by the connecting portions 54, become long, and the solder 60 flowed from the contact point 53 to the surface of the connecting portions 54 hardly flows into the surface of the individual electrode 52. Accordingly, the fluctuation in the jetting characteristics of the ink from the nozzle 15 is prevented.

Here, as it has been described above, since the connecting portions 54 are arranged to face both end portions of the pressure chamber 10 in the paper feeding direction, it may also be considered that the deformation amount of the piezoelectric layers 50 and 51, and the vibration plate 49 is decreased due to the effect of the solder 60 flowed into the surface of the connecting portion 54, and that the jetting characteristics of the ink from the nozzle 15 are changed. However, in the embodiment, as it has been described above, since the width of each of the connecting portions 54 is sufficiently smaller than the width of the individual electrode 52, the decrease in the deformation amount of the piezoelectric layers 50 and 51, and the vibration plate 49 due to the flowing of the solder 60 into the surface of the connecting portions 54 is smaller as compared to a case in which the solder 60 has flowed into the surface of the individual electrode 52.

Figure 6:
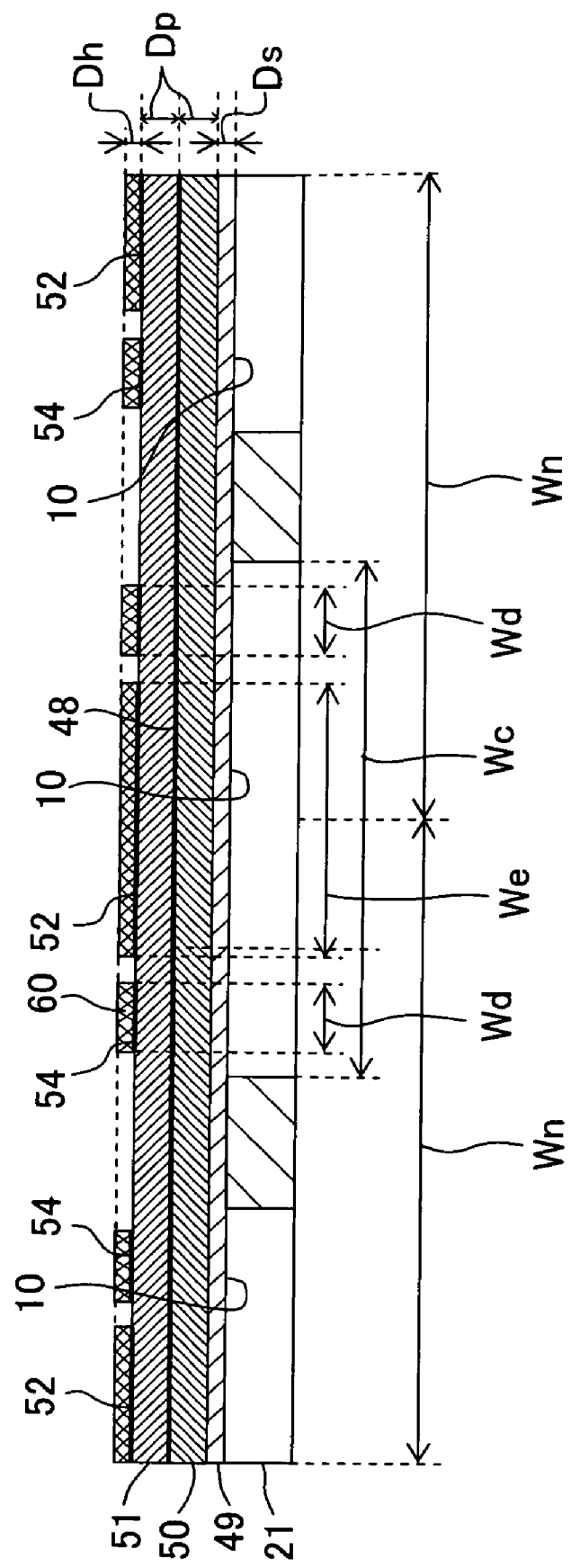
FIG. 6 is a diagram showing an analysis model for examining a change in an amount of displacement of a piezoelectric layer and a vibration plate due to solder.

Next, an analysis result showing a change in the deformation characteristics of the piezoelectric layers 50 and 51, and the vibration plate 49 due to the solder 60 flowed into the upper surface of the individual electrode 52 will be described below. FIG. 6 is a diagram showing an analysis model for examining the deformation characteristics of the piezoelectric layers 50 and 51, and the vibration plate 49.

The analysis model in FIG. 6 is a model in which, the pressure chamber 10, the vibration plate 49, the piezoelectric layers 50 and 51, the common electrode 48, the individual electrode 52, the connecting portions 54, and the solder 60 are modeled, in a cross section similarly as in FIG. 5. Moreover, in the analysis model in FIG. 6, a width Wc of the pressure chamber 10 is 360 μm, a thickness Ds of the vibration plate 49 is 10 μm, a thickness Dp of each of the piezoelectric layers 50 and 51 is 20 μm, a width We of the individual electrode 52 is 252 μm, a width Wd of each of the connecting portions 54 is 40 μm, and a distance Wn between centers of the adjacent pressure chambers 10 in the paper feeding direction (left-right direction in FIG. 6) is 508 μm. A thickness of each of the common electrode 48, the individual electrode 52, and the connecting portions 54 is let to be 0.

A result of the analysis carried out in the analysis model in FIG. 6 is shown in table 1. In the embodiment, the analysis is carried out for three cases namely, a case in which there is no solder 60 on both the individual electrode 52 and the connecting portions 54 (without solder), a case in which there is solder 60 only on the upper surface of the individual electrode 52 (solder on the surface of the individual electrode), and a case in which there is solder 60 only on the upper surface of the connecting portions 54 (solder on the surface of the connecting portion). A thickness Dh of the solder 60 flowed into the surface of the individual electrode 52 and the connecting portions 54 is 10 μm. Moreover, a displacement area in table 1 means a change amount of an area of the pressure chamber 10 in FIG. 6 due to the deformation of the piezoelectric layers 50 and 51, and the vibration plate 49, and the displacement area corresponds to a change amount of the volume of the pressure chamber 10.

TABLE 1

|  | Without solder | Solder on surface of individual electrode | Solder on surface of connecting portion |
| --- | --- | --- | --- |
| Displacement area ($\mu m^2$) | 7.2 | 4.6 | 6.7 |
| Rate of decrease in area (%) | — | 35 | 7 |

Improvement rate: 80%

As shown in table 1, when the solder 60 does not exist on both the surface of the individual electrode 52 and the surface of the connecting portions 54, the displacement area of the pressure chamber 10 is 7.2 ($\mu m^2$), whereas, when the solder 60 exists only on the upper surface of the individual electrode 52, the displacement area of the pressure chamber 10 is 4.6 ($\mu m^2$), and the displacement area of the pressure chamber 10 is decreased by about 35%. As in the embodiment, when the solder 60 exists only on the connecting portions 54, the displacement area of the pressure chamber 10 is 6.7 ($\mu m^2$), and the displacement area of the pressure chamber 10 is decreased by (to) 7%.

In other words, in the case in which the solder 60 exists only on the upper surface of the connecting portions 54, the decrease in the displacement amount of the piezoelectric layers 50 and 51, and the vibration plate 49 is improved to approximately 80% as compared to the case in which the solder 60 exists only on the upper surface of the individual electrode 52. Moreover, also from the abovementioned result, as it has been described above, it has been revealed that, due to the solder 60 not flowing into the surface of the individual electrode 52, the decrease in the deformation amount of the piezoelectric layers 50 and 51, and the vibration plate 49 is prevented. Further, it has been revealed that, even when the solder 60 has flowed into the surface of the connecting portion 54, the decrease in the deformation amount of the piezoelectric layers 50 and 51, and the vibration plate 49 is smaller than the case in which the solder 60 has flowed into the individual electrode 52.

According to the embodiment described above, since the connecting portions 54 connect the contact point 53 and the end of the individual electrode 52 on the side opposite to the contact point 53, and forms the bypass longer than the shortest path between the contact point 53 and the end portion, of the individual electrode 52, at the side of the contact point 53, between the contact point 53 and the individual electrode 52, each of the connecting portions 54 has a sufficiently long length, and the solder flowed from the contact point 53 into the surface of the connecting portions 54 hardly flows into the surface of the individual electrode 52. As a result, it is possible to prevent the solder 60 from being adhered to the surface of the individual electrode 52, and it is possible to prevent the decrease in the deformation amount of the piezoelectric layers 50 and 51, and the vibration plate 49 due to the effect of the solder 60 adhered.

Moreover, each of the connecting portions 54 is arranged on the piezoelectric layer 51 to face a portion, of the pressure chamber 10, on an outer side of a portion facing the individual electrode 52, and the connecting portions 54 are not arranged on a portion of the piezoelectric layer 51 facing a space between the adjacent pressure chambers 10 which are adjacent in the paper feeding direction. Therefore, it is possible to make short a distance between the pressure chambers 10, and to arrange the pressure chambers 10 highly densely.

Next, modified embodiments in which various modifications are made in the abovementioned embodiment will be described below. However, same reference numerals are assigned to components having the same structure as in the embodiment, and the description of such components is omitted.

Figure 7:
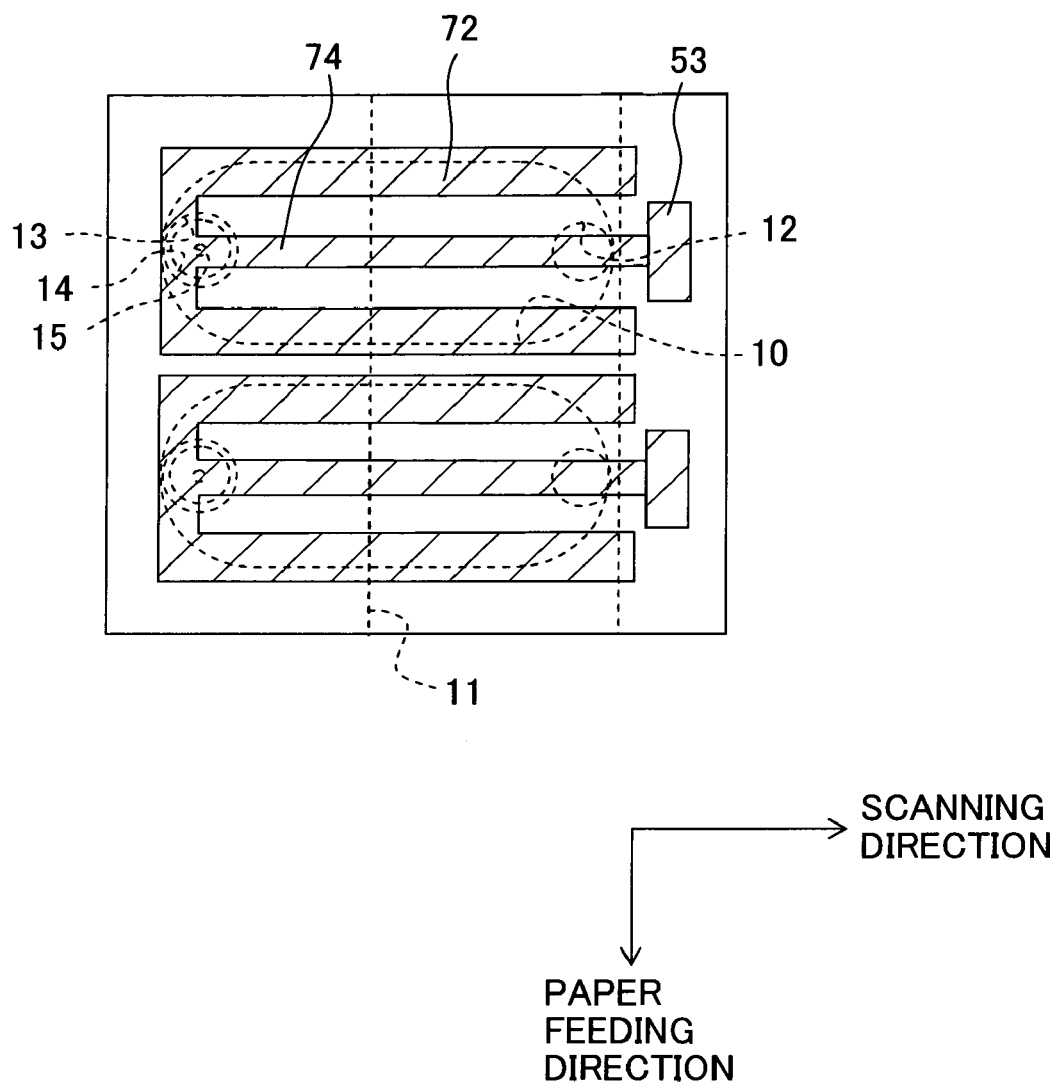
FIG. 7 is a diagram of a first modified embodiment corresponding to FIG. 3.

An arrangement of the individual electrode is not restricted to the arrangement described in the embodiment. In a first modified embodiment, as shown in FIG. 7, an individual electrode 72 is arranged to face both end portions in a direction of short side of the pressure chamber 10, and a portion spread over a portion on an outer side of the pressure chamber 10 adjacent to this portion (edge portion of the pressure chamber 10). Moreover, a connecting portion 74 extends in the scanning direction in a portion facing a substantially central portion in a short axis direction of the pressure chamber 10 on the upper surface of the piezoelectric layer 51 (the connecting portion 74 is arranged to face a portion, of the pressure chamber 10, on an inner side of a portion facing the individual electrode 72). Furthermore, the connecting portion 74 has one end portion in the scanning direction of the piezoelectric layer 51 connected to the contact point 53 on an outer side of a portion facing the pressure chamber 10, and an end portion on the side opposite to the contact point 53 extends separately in two directions, in the short axis direction of the pressure chamber 10, and connected to an end of the individual electrode 72 on a side opposite to the contact point 53. A width of the connecting portion 74 is sufficiently short with respect to a width of the individual electrode 72.

In a case in which the individual electrode 72 is arranged to face the edge portion of the pressure chamber 10, when the individual electrode 72 is kept at the ground electric potential, and when the driving electric potential is applied to the individual electrode 72, a portion of the piezoelectric layers 50 and 51 facing the edge portion of the pressure chamber 10 is contracted in a horizontal direction. At this time, since out of the piezoelectric layers 50 and 51, and the vibration plate 49, portions facing both end portions of the individual electrode 72 in the paper feeding direction are fixed to walls between the adjacent pressure chambers 10, when the piezoelectric layer 51 is contracted, these portions of the vibration plate 49 and the piezoelectric layer 50 are pulled toward an outer side in a direction of short axis of the pressure chamber 10. Consequently, the portion, of the piezoelectric layers 50 and 51, and the vibration plate 49, is deformed to form a projection toward the side opposite to the pressure chamber 10 as a whole. Accordingly, since the volume of the pressure chamber 10 is increased, and a pressure of (on) the ink inside the pressure chamber 10 is decreased, the ink flows from the manifold channel 11 to the pressure chamber 10. Moreover, when the individual electrode 72 is returned to the ground electric potential, due to the deformation of the piezoelectric layer 51 and the vibration plate 49 returning to an original shape, the volume of the pressure chamber 10 is increased. Accordingly, the pressure in the pressure chamber 10 is increased, and the ink is jetted from the nozzle 15 which communicates with the pressure chamber 10.

Even in this case, since the connecting portion 74 extends from the contact point 53, and is connected to an end of the individual electrode 72 on an opposite side of the contact point 53, a length of the path connecting the individual electrode 72 and the contact point 53 formed by the connecting portion 74 is long, and the solder 60 which has flowed out from the contact point 53 into the surface of the connecting portion 74 hardly flows from the connecting portion 74 into the surface of the individual electrode 72. Consequently, the jetting characteristics of the ink jetted from the nozzle 15 are prevented from being fluctuated similarly as in the embodiment.

Here, since the connecting portion 74 is arranged to face the substantially central portion of the pressure chamber 10 in the paper feeding direction, due to the effect of the solder 60 flowed into the surface of the connecting portion 74, the deformation amount of the piezoelectric layer 51 and the vibration plate 49 is decreased, and the jetting characteristics of the ink jetted from the nozzle 15 can be considered to be changed. However, in the first modified embodiment, since the width of the connecting portion 74 is sufficiently smaller than the width of the individual electrode 72, the decrease in the deformation amount of the piezoelectric layers 50 and 51, and the vibration plate 49 due to the flowing of the solder into the surface of the connecting portion 74 is smaller as compared to the case in which, the solder 60 has flowed into the surface of the individual electrode 72.

Furthermore, even in this case, since the connecting portion 74 is arranged on the piezoelectric layer 50 at a portion facing the substantially central portion of the pressure chamber 10, and is not arranged on a portion facing the portion between the adjacent pressure chambers 10 in the paper feeding direction, it is possible to shorten the distance between the adjacent pressure chambers 10, and to arrange the pressure chambers 10 highly densely, similarly as in the embodiment.

Figure 8:
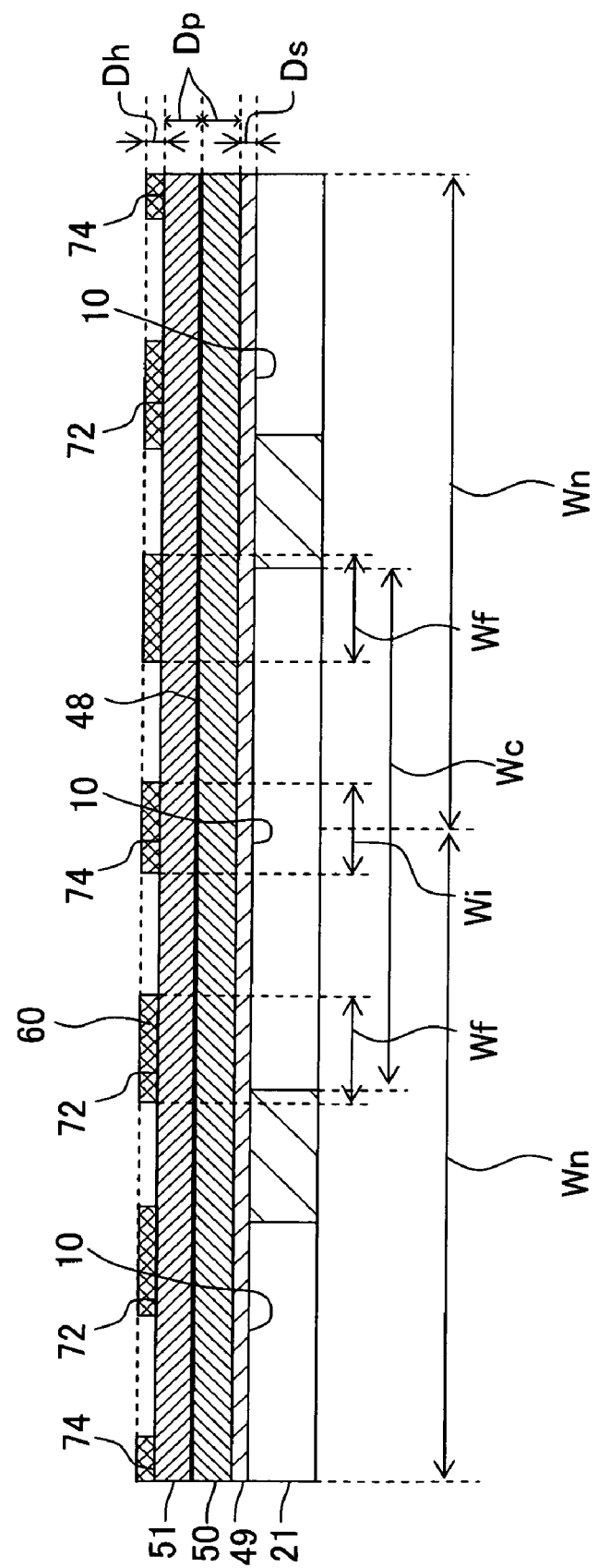
FIG. 8 is an analysis model of the first modified embodiment corresponding to FIG. 6.

FIG. 8 shows an analysis model in which an analysis similar to the embodiment is carried out in the first modified embodiment, and table 2 shows a result of the analysis carried out by this analysis model. In the analysis model in FIG. 8, a width Wf of the individual electrode 72 is 117 μm, a width Wi of the connecting portion 74 is 100 μm. The other widths and thicknesses are similar as in the analysis model in FIG. 6.

TABLE 2

|  | Without solder | Solder on surface of individual electrode | Solder on surface of connecting portion |
|---|---|---|---|
| Displacement area (μm$^2$) | 5.3 | 3.6 | 4.2 |
| Rate of decrease in area (%) | — | 32 | 21 |

Improvement rate: 66%

As shown in table 2, in a case of the first modified embodiment, when the solder 60 does not exist on both the surface of the individual electrode 72 and the surface of the connecting portion 74, the displacement area of the pressure chamber 10 is 5.3 (μm$^2$), whereas, when the solder 60 exists only on the upper surface of the individual electrode 72, the displacement area of the pressure chamber 10 is 3.6 (μm$^2$), and the displacement area of the pressure chamber 10 is decreased by about 32%. On the other hand, when the solder 60 exists only on the upper surface of the connecting portion 74, the displacement area of the pressure chamber 10 is 4.2 (μm$^2$), and is decreased by 21%.

In other words, in the case in which, the solder 60 exists only on the upper surface of the connecting portion 74, the decrease in the displacement amount of the piezoelectric layers 50 and 51, and the vibration plate 49 is improved to approximately 66% as compared to the case in which the solder 60 exists only on the upper surface of the individual electrode 72. Also from the abovementioned result, as it has been described above, it is revealed that, due to the solder 60 not flowing into the surface of the individual electrode 72, the decrease in the deformation amount of the piezoelectric layers 50 and 51, and the vibration plate 49 is prevented, and even when the solder 60 has flowed into the surface of the connecting portion 74, the decrease in the deformation amount of the piezoelectric layers 50 and 51, and the vibration plate 49 is smaller as compared to the case in which, the solder 60 has flowed into the individual electrode 72.

Figure 9:
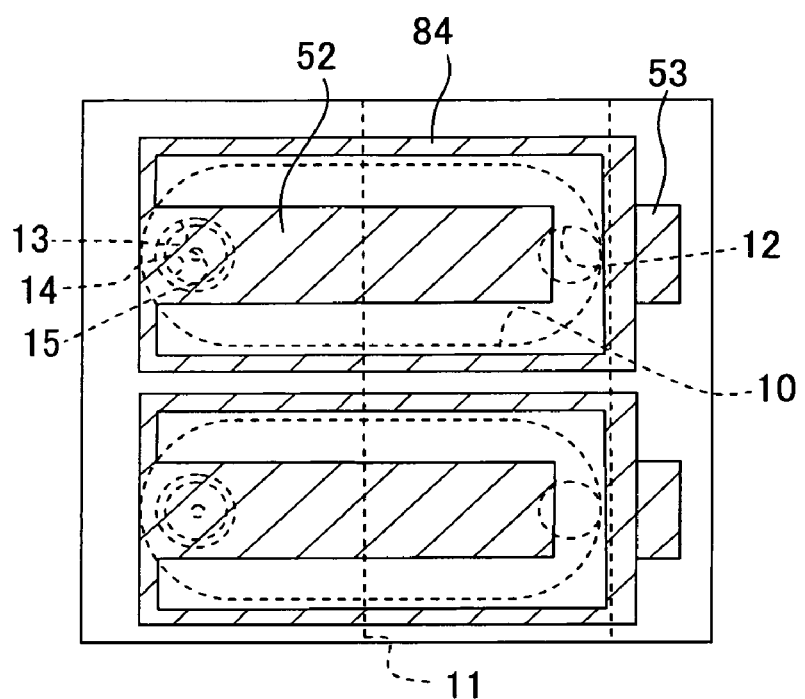
FIG. 9 is a diagram of a second modified embodiment corresponding to FIG. 3.

In a second modified embodiment, as shown in FIG. 9, connecting portions 84 extend in the scanning direction at a portion, of the piezoelectric layer 51, facing a portion between the adjacent pressure chambers 10 in the paper feeding direction. Moreover, both end portions of the connecting portions 84 are bent toward an inner side in the short axis direction of the pressure chamber 10, and are connected to the contact point 53, and the end of the individual electrode 52, on the opposite side of the contact point 53. When the connecting portion 84 is arranged to face the pressure chamber 10, the deformation amount of the piezoelectric layer 51 and the vibration plate 49 is slightly decreased due to the effect of the solder 60 which has flowed from the contact point 53 into a surface of the connecting portion 84, and there is a possibility that the jetting characteristics of the ink jetted from the nozzle 15 are changed slightly. However, in the second modified embodiment, since the connecting portion 84 is arranged not to face the pressure chamber 10, even when the solder 60 flows from the contact point 53 into the connecting portion 84, the jetting characteristics of the ink jetted from the nozzle 15 are not changed.

Figure 10:
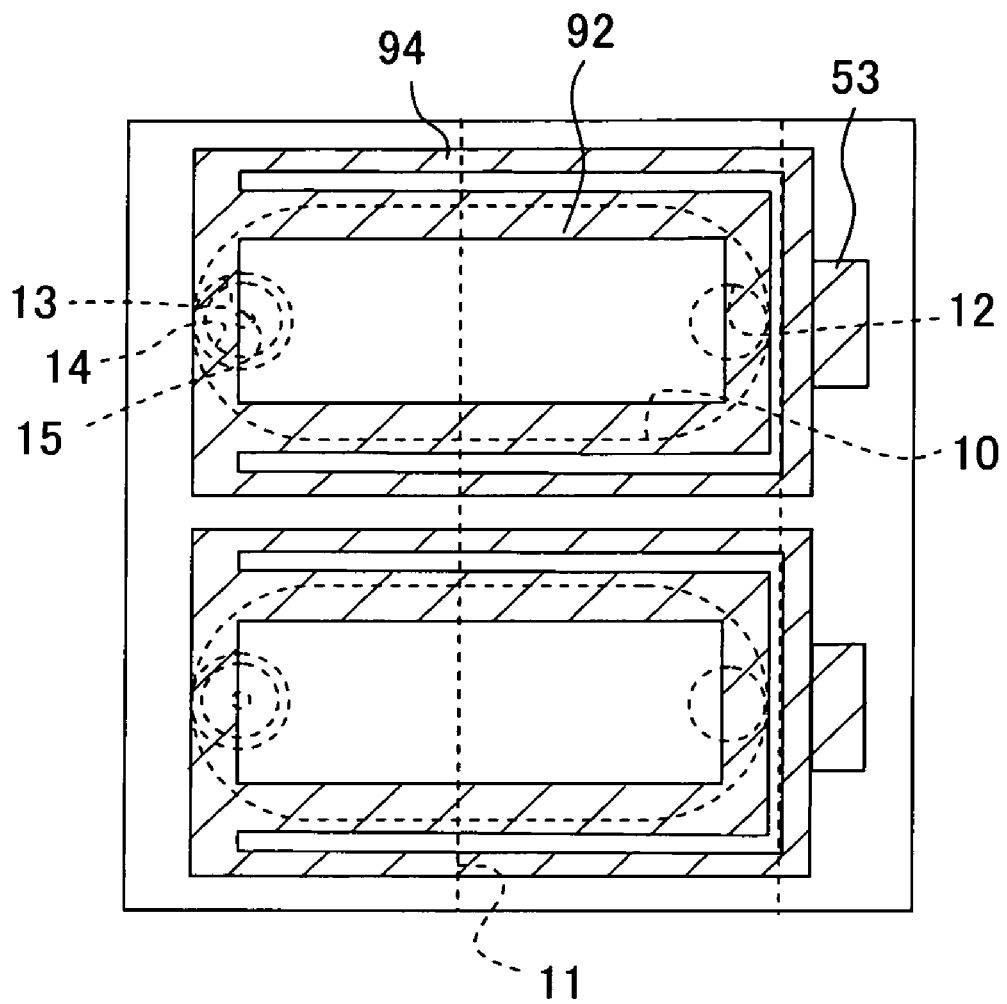
FIG. 10 is a diagram of a third modified embodiment corresponding to FIG. 3.

Moreover, a structure, in which a connecting portion is arranged in a portion of the piezoelectric layer 51 to face a portion between the adjacent pressure chambers 10 in the paper feeding direction, is not restricted to a case in which an individual electrode is arranged to face the substantially central portion 10, as the individual electrode 52. In a third modified embodiment, for example, an individual electrode 92 having a substantially rectangular ring shape is arranged on the upper surface of the piezoelectric layer 51 at a portion facing the edge portion of the pressure chamber 10 as shown in FIG. 10. Moreover, connecting portions 94 extend in the scanning direction at portions on the upper surface of the piezoelectric layer 51 facing the portions between the adjacent pressure chambers 10 in the paper feeding direction, at both end portions thereof are bent toward the inner side in the direction of short axis of the pressure chamber 10, and are connected to the contact point 53 and an end of the individual electrode 92 on the opposite side of the contact point 53.

Figure 11:
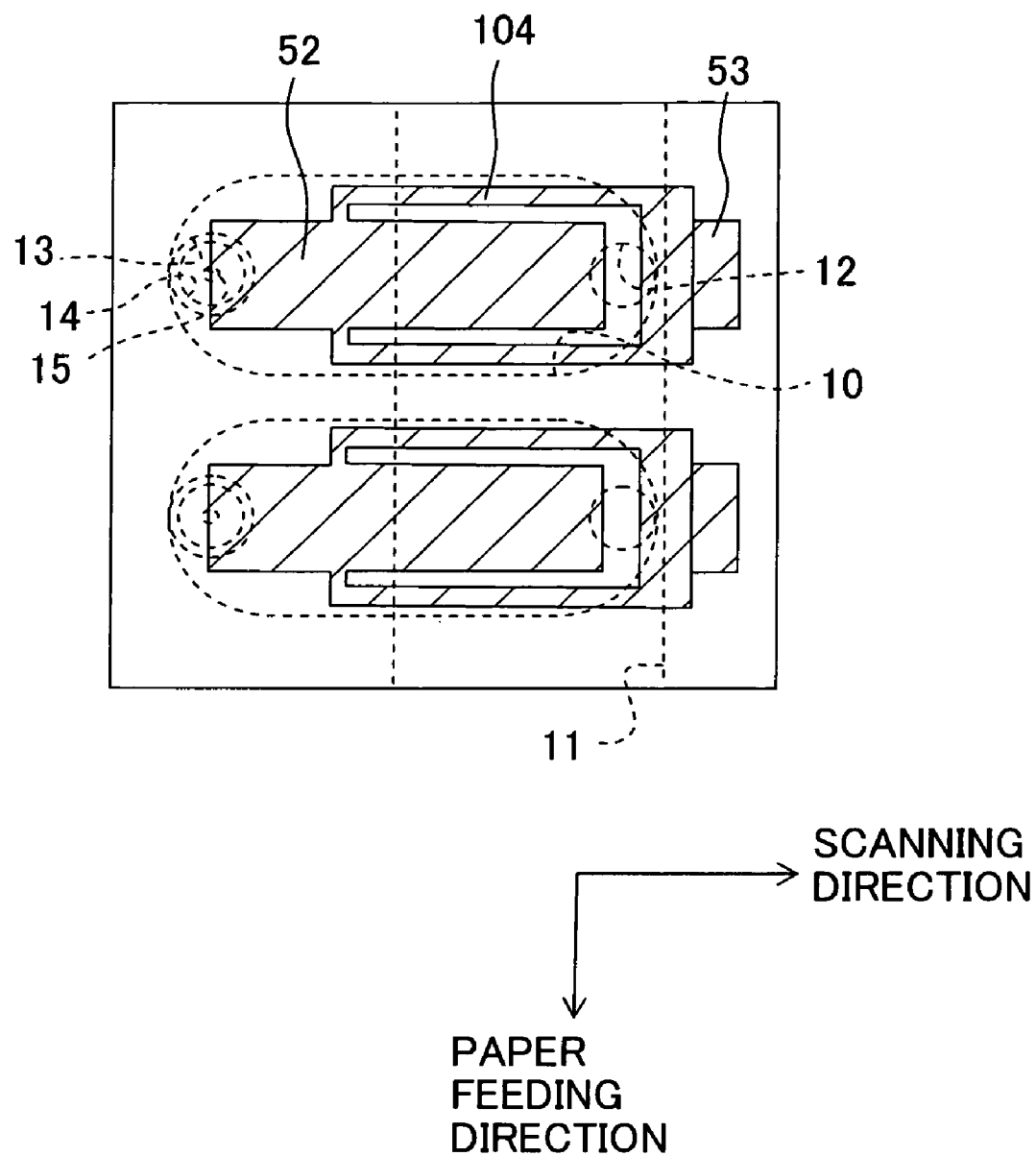
FIG. 11 is a diagram of a fourth modified embodiment corresponding to FIG. 3.

In the abovementioned description, the contact point and the end of the individual electrode on the opposite side of the contact point are connected by the connecting portion. However, the structure is not restricted to such arrangement. In a fourth modified embodiment, a connecting portion 104 has an end portion on the opposite side of the contact point 53 connected to a half-way portion in a longitudinal direction of the individual electrode 52 (a portion of the individual electrode 52 different from the nearest portion to the contact point 53) as in FIG. 11.

Even in this case, since the solder 60 which has flowed out from the contact point 53 into a surface of the connecting portion 104 hardly flows into the upper surface of the individual electrode 52, it is possible to prevent the jetting characteristics of the ink jetted from the nozzle 15 from being changed.

Figure 12:
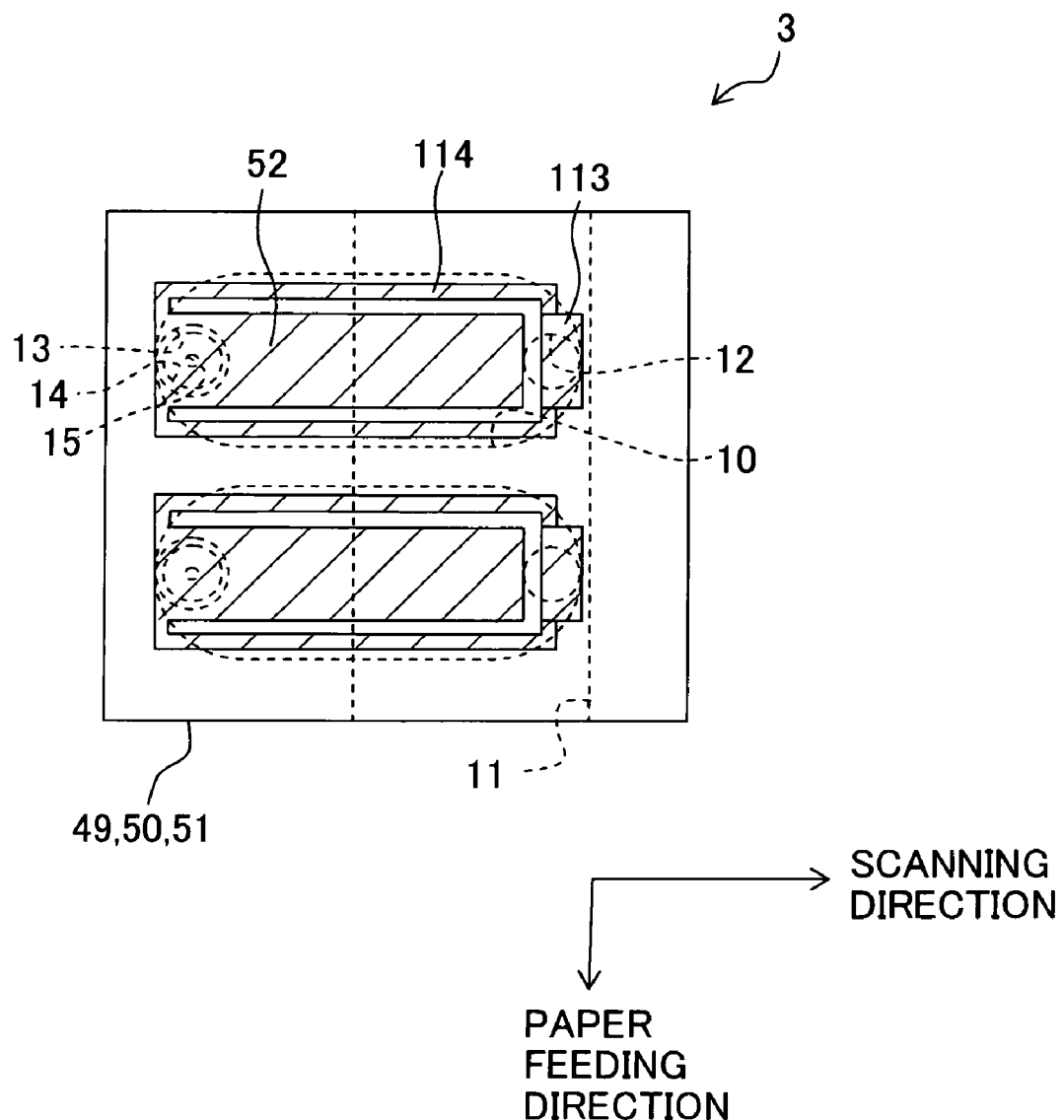
FIG. 12 is a diagram of a fifth modified embodiment corresponding to FIG. 3.

Moreover, as it has been described above, the contact point 53 is arranged on the upper surface of the piezoelectric layer 51 at the portion not facing the pressure chamber 10. However, the structure is not restricted to this structure. In a fifth modified embodiment, a contact portion 113 is formed on the upper surface of the piezoelectric layer 51 at a portion facing an end portion at the side of the through hole 12 in the longitudinal direction of the pressure chamber 10, and the contact portion 113 and the end of the individual electrode 52 on the opposite side of the contact point 53 are connected by connecting portions 114 arranged in portions facing both end portions in the short axis direction of the pressure chamber 10 as shown in FIG. 12.

In this case, since the solder 60 is positioned on an upper surface of the contact point 113, the deformation amount of the piezoelectric layers 50 and 51, and the vibration plate 49 is considered to be decreased due to the effect of the solder 60. However, in a piezoelectric actuator, a portion of the piezoelectric layers 50 and 51, and the vibration plate 49, facing the substantially central portion in the longitudinal direction of the pressure chamber 10 is deformed most substantially, and portions of the piezoelectric layers 50 and 51, and the vibration plate 49, facing both end portions in the longitudinal direction in the pressure chamber 10 are not deformed so substantially. Consequently, an effect on the jetting characteristics of the ink jetted from the nozzle 15 due to the adhering of the solder 60 to a surface of the contact point 113 is small as compared to a case in which the solder 60 is adhered to a substantially central portion of the individual electrode 52.

Figure 13:
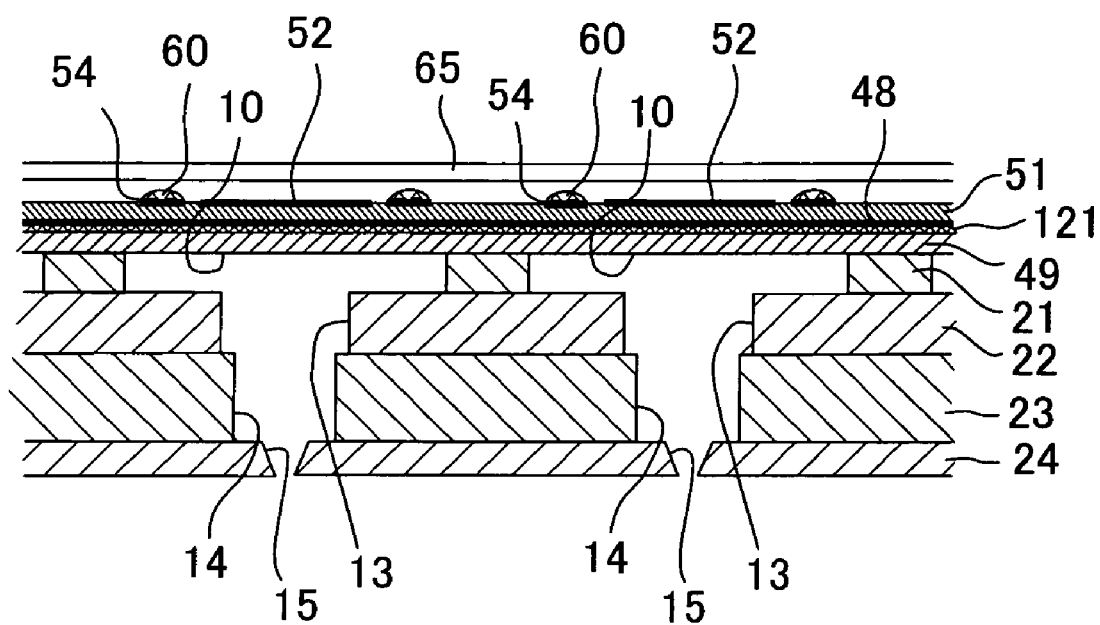
FIG. 13 is a diagram of a sixth modified embodiment corresponding to FIG. 5.

Moreover, in the embodiment, the piezoelectric layers 50 and 51 are arranged on the upper surface of the vibration plate 49, and the common electrode 48 is formed on the upper surface of the piezoelectric layer 50. However, the structure is not restricted to such structure. For example, in a sixth modified embodiment, the piezoelectric layer 50 is not provided, and an insulating layer 121 formed of an insulating material such as a synthetic resin is arranged on the upper surface of the vibration plate 49, and the common electrode 48 is formed on an upper surface of the insulating layer 121 as shown in FIG. 13.

Figure 14:
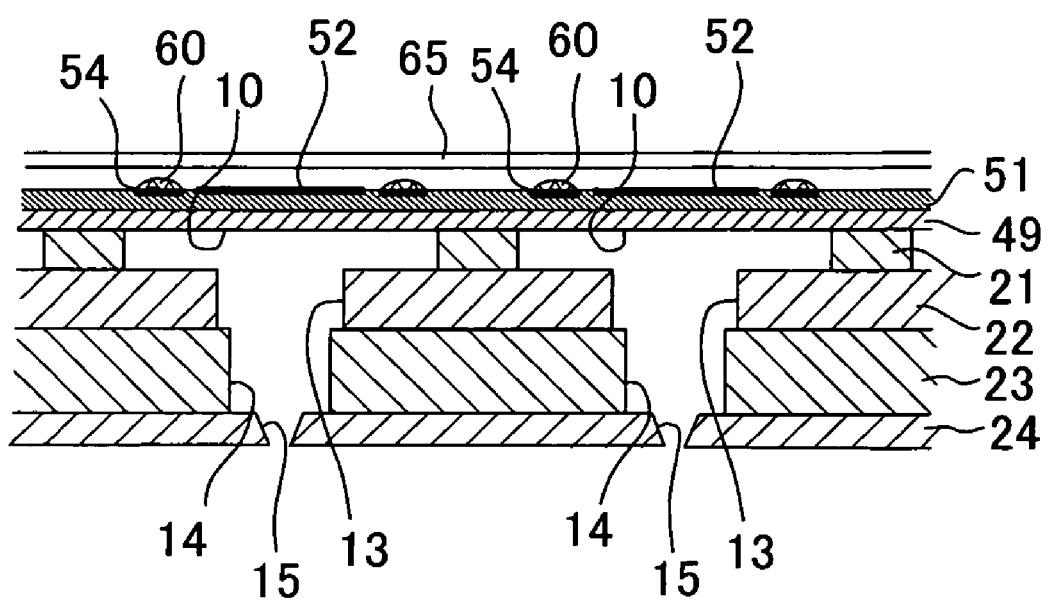
FIG. 14 is a diagram of a seventh modified embodiment corresponding to FIG. 5.

Moreover, in a seventh modified embodiment, as shown in FIG. 14, the piezoelectric layer 50 and the common electrode 48 are not provided, and the vibration plate 49 formed of an electroconductive material is kept at the ground electric potential all the time, and the vibration plate 49 also serves as the common electrode.

Figure 15:
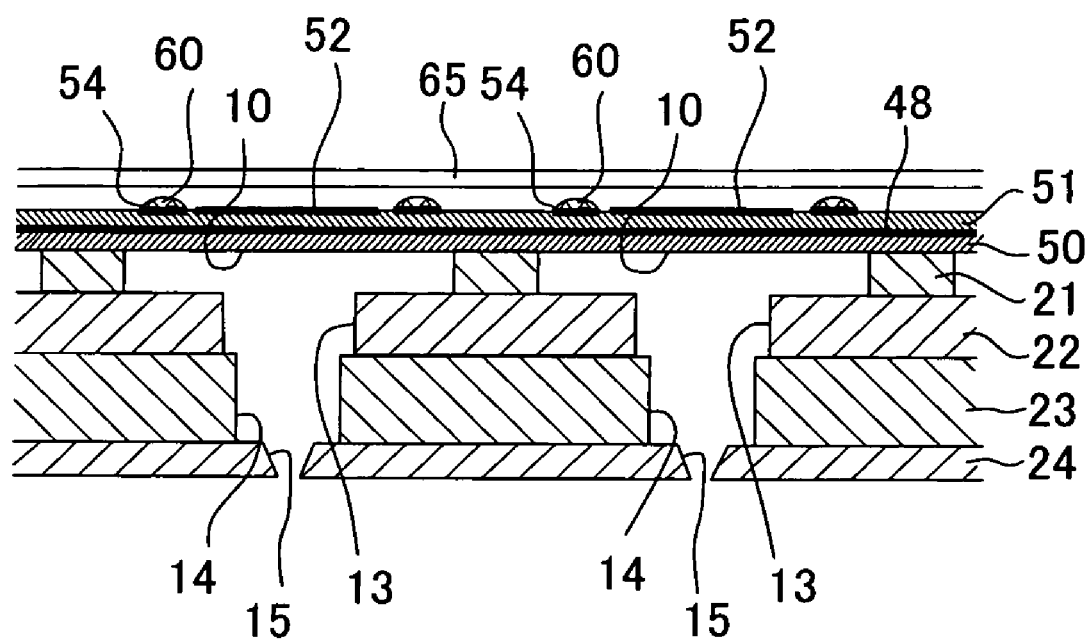
FIG. 15 is a diagram of an eighth modified embodiment corresponding to FIG. 5.

Furthermore, in an eighth modified embodiment, as shown in FIG. 15, the vibration plate 49 is not provided, and the piezoelectric layer 50 is provided on the upper surface of the cavity plate 21, and the plurality of pressure chambers 10 is covered by the piezoelectric layer 50. In this case, the piezoelectric layer 50 corresponds to the vibration plate according to the present invention.

Moreover, in the embodiment, the contact point 53 and the FPC 65 are joined by the solder 60. However, it is not restricted to this structure, and the contact point 53 and the FPC 65 may be joined by an electroconductive adhesive in a fluid form, made of a thermosetting resin which includes a metal or a light curing resign including a metal. In this case, it is possible to connect the contact point 53 and the FPC 65 by applying the fluid electroconductive adhesive on an upper surface of the contact point 53, and heating after arranging the FPC 65 thereon (changing a surrounding temperature), or by hardening the electroconductive adhesive by irradiation of light. In this case, when the electroconductive adhesive is applied, there is a possibility that the electroconductive adhesive flows from the contact point 53 into the surface of the connecting portions 54. However, similarly as in the embodiment, the electroconductive adhesive hardly flows from the surface of the connecting portions 54 into the surface of the individual electrode 52. Therefore, it is possible to prevent a decrease in the deformation amount of the piezoelectric layers 50 and 51, and the vibration plate 49 due to the electroconductive adhesive.

In the abovementioned description, an example in which the liquid transporting apparatus according to the present invention is applied to an ink-jet head which jets ink from the nozzles 15 has been described. However, without restricting to this, the present invention is also applicable to a liquid transporting apparatus which transports a liquid in a liquid channel by applying a pressure to a liquid other than ink in the pressure chamber.

Moreover, in the abovementioned description, the piezoelectric actuator according to the present invention is applied to a piezoelectric actuator for applying a pressure to the liquid in the pressure chamber. However, without restricting to this, the present invention is also applicable to a piezoelectric actuator which drives an object by deformation of the piezoelectric layer and the vibration plate.

What is claimed is:

1. A liquid transporting apparatus which transports a liquid, comprising: a channel unit which has a liquid transporting channel through which the liquid flows, and a pressure chamber which is formed in the liquid transporting channel; a piezoelectric actuator which applies a pressure to the liquid in the pressure chamber and which has: a vibration plate covering the pressure chamber; a piezoelectric layer formed on a surface, of the vibration plate, that is not facing the pressure chamber; an electrode, formed on a surface of the piezoelectric layer, that is not facing the vibration plate at a portion facing the pressure chamber; a contact point, formed on the surface of the piezoelectric layer, that is not facing the vibration plate; and a connecting portion, formed on the surface of the piezoelectric layer, that is not facing the vibration plate and connecting the electrode and the contact point; and a driver IC which applies a driving voltage to the piezoelectric actuator; and a wiring member which connects the driver IC and the piezoelectric actuator, and to which the contact point is connected via an electroconductive adhesive; wherein the connecting portion extends from the contact point and is connected to a portion, of the electrode, which is different from a nearest portion nearest to the contact point; and wherein the electrode extends in a predetermined direction from the nearest portion, and the connecting portion is connected to an end portion of the electrode on a side opposite to the nearest portion.

2. The liquid transporting apparatus according to claim 1; wherein the connecting portion forms a bypass which has a length longer than a shortest distance between the contact point and the nearest portion.

3. The liquid transporting apparatus according to claim 1; wherein the electrode is arranged to face a central portion of the pressure chamber, and the connecting portion is arranged to face a portion, of the pressure chamber, at outside of the central portion of the pressure chamber.

4. The liquid transporting apparatus according to claim 1; wherein the electrode is arranged to face a peripheral portion of the pressure chamber, and the connecting portion is arranged to face a portion, of the pressure chamber, at inner side of the peripheral portion of the pressure chamber.

5. The liquid transporting apparatus according to claim 1; wherein the connecting portion is arranged on the piezoelectric layer at outside of a portion of the piezoelectric layer facing the pressure chamber.

6. The liquid transporting apparatus according to claim 1; wherein the contact point, the connecting portion, and the electrode are formed of a same electroconductive material.

7. A piezoelectric actuator comprising: a vibration plate; a piezoelectric layer which is formed on one surface of the vibration plate; an electrode, formed on a surface of the piezoelectric layer, that is not facing the vibration plate; a contact point, formed on the surface of the piezoelectric layer, that is not facing the vibration plate, and connected via an electroconductive adhesive to a wiring member which applies a drive voltage to the electrode; and a connecting portion, formed on the surface of the piezoelectric layer, that is not facing the vibration plate, and connecting the electrode and the contact point, wherein the connecting portion extends from the contact point, and is connected to a portion, of the electrode, which is different from a nearest portion nearest to the contact point; and wherein the electrode extends in a predetermined direction from the nearest portion, and the connecting portion is connected to an end portion of the electrode on a side opposite to the nearest portion.

8. The piezoelectric actuator according to claim 7;
wherein the connecting portion forms a bypass which has a length longer than the shortest distance between the contact point and the nearest portion.

9. The piezoelectric actuator according to claim 7;
wherein the electrode is arranged to face a central portion of the pressure chamber, and the connecting portion is arranged to face a portion, of the pressure chamber, at outside of the central portion of the pressure chamber.

10. The piezoelectric actuator according to claim 7;
wherein the electrode is arranged to face a peripheral portion of the pressure chamber, and the connecting portion is arranged to face a portion, of the pressure chamber, at inside of the peripheral portion of the pressure chamber.

11. The piezoelectric actuator according to claim 7;
wherein the connecting portion is arranged on the piezoelectric layer at outside of a portion of the piezoelectric layer facing the pressure chamber.

12. The piezoelectric actuator according to claim 7;
wherein the contact point, the connecting portion, and the electrode are formed of a same electroconductive material.

* * * * *